United States Patent
Chin et al.

(10) Patent No.: US 8,946,878 B2
(45) Date of Patent: Feb. 3, 2015

(54) INTEGRATED CIRCUIT PACKAGE-IN-PACKAGE SYSTEM HOUSING A PLURALITY OF STACKED AND OFFSET INTEGRATED CIRCUITS AND METHOD OF MANUFACTURE THEREFOR

(75) Inventors: Chee Keong Chin, Shanghai (CN); Jae Hak Yee, Shanghai (CN); Yu Feng Feng, Shanghai (CN); Frederick Cruz Santos, Shanghai (CN)

(73) Assignee: STATS ChipPAC Ltd., Singapore (SG)

( * ) Notice: Subject to any disclaimer, the term of this patent is extended or adjusted under 35 U.S.C. 154(b) by 851 days.

(21) Appl. No.: 11/951,958

(22) Filed: Dec. 6, 2007

(65) Prior Publication Data

US 2009/0146271 A1 Jun. 11, 2009

(51) Int. Cl.
*H01L 23/02* (2006.01)
*H01L 23/495* (2006.01)
*H01L 23/31* (2006.01)
*H01L 23/00* (2006.01)

(52) U.S. Cl.
CPC ...... *H01L 23/49575* (2013.01); *H01L 23/3135* (2013.01); *H01L 23/3107* (2013.01); *H01L 2224/48091* (2013.01); *H01L 2224/48247* (2013.01); *H01L 2225/06562* (2013.01); *H01L 24/48* (2013.01); *H01L 2224/32145* (2013.01); *H01L 2224/32245* (2013.01); *H01L 2224/73265* (2013.01); *H01L 2924/19107* (2013.01)
USPC .......................................... 257/686; 257/685

(58) Field of Classification Search
CPC .................. H01L 23/49757; H01L 23/3107; H01L 23/3135; H01L 2224/32145; H01L 2225/06506; H01L 2224/49174; H01L 2224/48145; H01L 2224/25174; H01L 2925/0655; H01L 2224/24145
USPC ......... 257/777, 784, 735, 734, 690, 687, 676, 257/666, 723, 685, 686, 678
See application file for complete search history.

(56) References Cited

U.S. PATENT DOCUMENTS

| | | | |
|---|---|---|---|
| 6,087,722 A | 7/2000 | Lee et al. | |
| 6,104,084 A | 8/2000 | Ishio et al. | |
| 6,476,474 B1 | 11/2002 | Hung | |
| 6,603,072 B1 | 8/2003 | Foster et al. | |
| 6,781,243 B1 | 8/2004 | Li et al. | |
| 7,193,309 B2 | 3/2007 | Huang et al. | |
| 8,218,346 B2 * | 7/2012 | Baek | 365/63 |
| 2005/0104170 A1* | 5/2005 | Nakamura | 257/676 |
| 2006/0249839 A1* | 11/2006 | Yoshida | 257/723 |
| 2007/0194417 A1* | 8/2007 | Yoshida | 257/678 |
| 2007/0194462 A1* | 8/2007 | Kim et al. | 257/787 |
| 2013/0015570 A1* | 1/2013 | Sato | 257/737 |

* cited by examiner

*Primary Examiner* — Marcos D Pizarro Crespo
*Assistant Examiner* — Diana C Vieira
(74) *Attorney, Agent, or Firm* — Ishimaru & Associates LLP

(57) ABSTRACT

An integrated circuit package-in-package system is provided including mounting first integrated circuits stacked in a first offset configuration over a die-attach paddle having a first edge and a second edge, opposing the first edge; connecting the first integrated circuits and a second edge lead adjacent the second edge; mounting second integrated circuits stacked in a second offset configuration, below and to the die-attach paddle; connecting the second integrated circuits and a first edge lead adjacent to the first edge; and encapsulating the first integrated circuits, second integrated circuits, and the die-attach paddle, with the first edge lead and the second edge lead partially exposed.

9 Claims, 2 Drawing Sheets

INTEGRATED CIRCUIT PACKAGE-IN-PACKAGE SYSTEM HOUSING A PLURALITY OF STACKED AND OFFSET INTEGRATED CIRCUITS AND METHOD OF MANUFACTURE THEREFOR

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality.

A variation of existing technologies uses mature package technologies with lead fingers made from lead frames. Typical lead frame packaging schemes pack more integrated circuits into a single package. As lead frame based packaging technologies are used with new integration and stacking structures, overall package yield becomes a concern.

Thus, a need still remains for an integrated circuit package-in-package system providing low cost manufacturing, reduced form factor, and improved yield for the integrated circuit package-in-package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including mounting first integrated circuits stacked in a first offset configuration over a die-attach paddle having a first edge and a second edge, opposing the first edge; connecting the first integrated circuits and a second edge lead adjacent the second edge; mounting second integrated circuits stacked in a second offset configuration, below and to the die-attach paddle; connecting the second integrated circuits and a first edge lead adjacent to the first edge; and encapsulating the first integrated circuits, second integrated circuits, and the die-attach paddle, with the first edge lead and the second edge lead partially exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
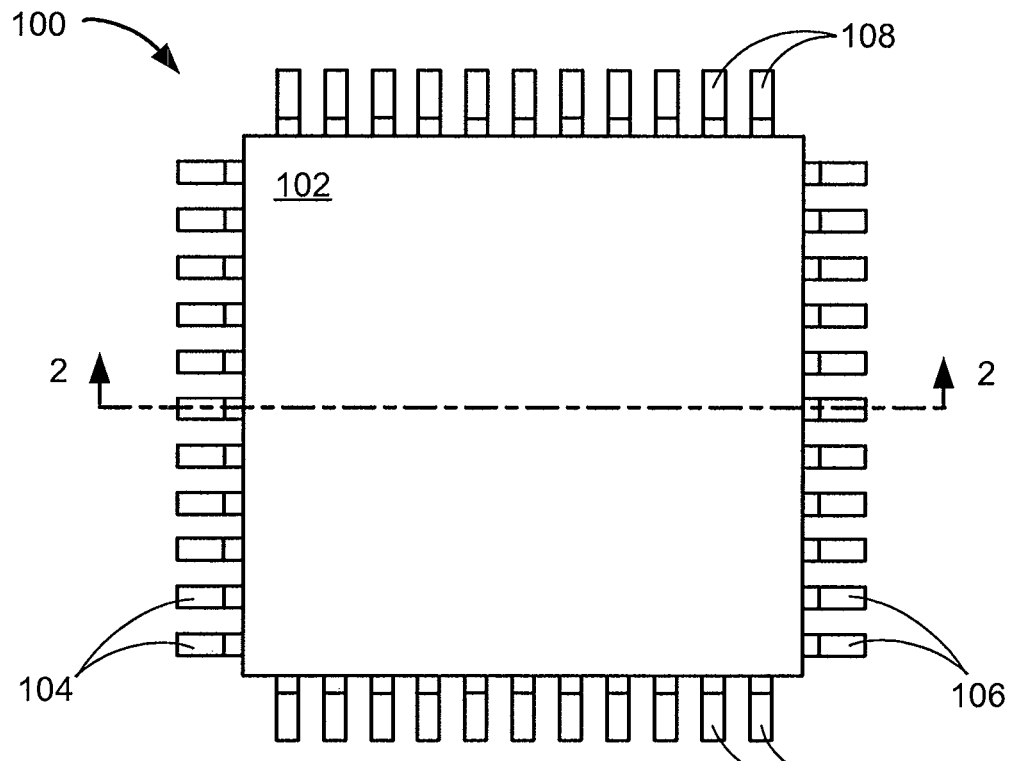
FIG. 1 is a top view of an integrated circuit package-in-package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a top view of an integrated circuit package-in-package system 100 in an embodiment of the present invention. As depicted in FIG. 1, the integrated circuit package-in-package system 100 is shown with a package encapsulation 102, such as molding compound, having a first edge lead 104, a second edge lead 106, a third edge lead 108 and a fourth edge lead 110, partially exposed along the periphery of the package encapsulation 102. The first edge lead 104, the second edge lead 106, the third edge lead 108, and the fourth edge lead 110 each comprises metal, such as the metal lead of a lead frame.

Figure 2:
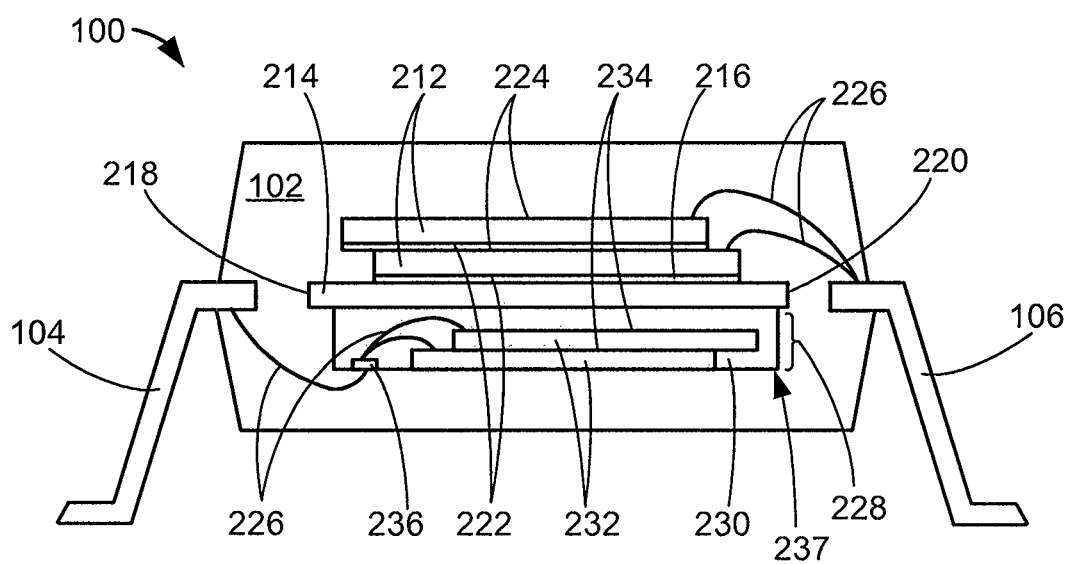
FIG. 2 is a cross-sectional view of the integrated circuit package-in-package system of FIG. 1 along line 2-2.

Referring now to FIG. 2, therein is shown a cross-sectional view of the integrated circuit package-in-package system 100 of FIG. 1 along line 2-2. As shown in FIG. 2, first integrated circuits 212, such as integrated circuit dice, are mounted above a die-attach paddle 214 with an adhesive 216, such as a die-attach adhesive. The die-attach paddle 214 includes a first edge 218 and a second edge 220 opposing the first edge 218. The first integrated circuits 212 are stacked above the die-attach paddle 214 in an offset configuration towards the first edge 218 of the die-attach paddle 214, with a first non-active side 222 of each of the first integrated circuits 212 facing the die-attach paddle 214. A first active side 224 of each of the first integrated circuits 212, opposing the first non-active side 222, is exposed to allow an electrical interconnect 226, such as a wire bond, to connect the first active side 224 and the second edge lead 106, adjacent to the second edge 220 of the die-attach paddle 214.

An integrated circuit package system 228 having an inner encapsulation 230, such as an epoxy mold compound, is mounted below and to the die-attach paddle 214. The integrated circuit package system 228 includes second integrated circuits 232 also stacked in an offset configuration below the die-attach paddle 214 towards the second edge 220. A second active side 234 of each of the second integrated circuits 232 faces the die-attach paddle 214 and is exposed for electrical connection. The second active side 234 is electrically connected with the electrical interconnect 226 to a first external contact 236 of the integrated circuit package system 228. The first external contact 236 is partially exposed by the inner encapsulation 230 towards the first edge 218 of the die-attach paddle 214. The inner encapsulation 230 covers the second integrated circuits 232, the electrical interconnect 226 between each of the second integrated circuits 232 and the first external contact 236, and partially exposes the first external contact 236 for further electrical connections. One of the second integrated circuits 232 is partially exposed from the inner encapsulation 230.

The electrical interconnect 226 connects between the first external contact 236 and the first edge lead 104, adjacent to the first edge 218 of the die-attach paddle 214. The package encapsulation 102, such as epoxy mold compound, covers the first integrated circuits 212, the integrated circuit package system 228, the electrical interconnect 226, and partially exposes the first edge lead 104 and the second edge lead 106 for further electrical connection to the next system level, such as a printed circuit board. Between the inner encapsulation 230 of the integrated circuit package system 228 and the package encapsulation 230 is a boundary portion 237 where the inner encapsulation 230 and the package encapsulation 102 meet and that separates the inner encapsulation 230 from the package encapsulation 102.

For illustrative purposes, the first integrated circuits 212 are shown with two integrated circuit dice stacked in an offset configuration, although it is understood that the number of integrated circuits or types of integrated circuits may differ. Also for illustrative purposes, the integrated circuit package system 228 is shown having two integrated circuit dice stacked in the offset configuration, although it is also understood that the number of integrated circuits or types of integrated circuits may also differ.

It has been discovered that the first integrated circuits 212 stacked in the offset configuration towards the first edge 218 and above the die-attach paddle 214, and the second integrated circuits 232 stacked also in the offset configuration towards the second edge 220 and below the die-attach paddle 214 provides a more balanced weight distribution of the integrated circuits stacked within the package encapsulation 102.

Figure 3:
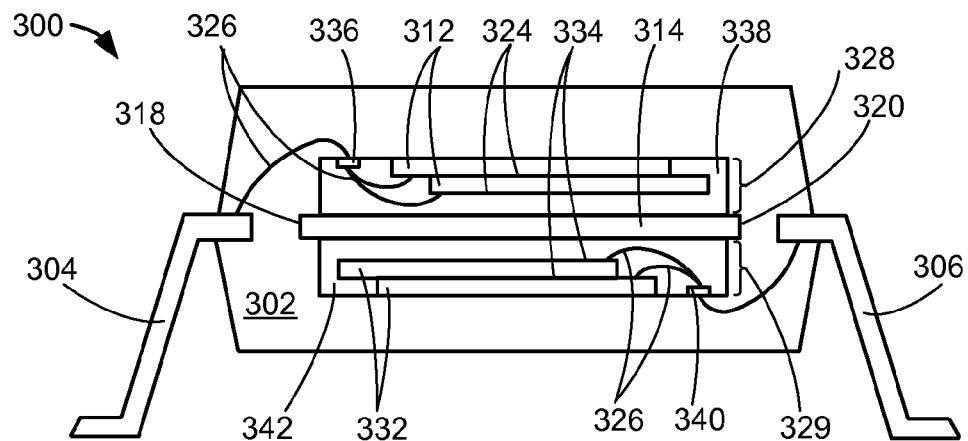
FIG. 3 is a cross-sectional view of an integrated circuit package-in-package system as exemplified by the top view of FIG. 1 in a second embodiment of the present invention.

Referring now to FIG. 3, therein is shown a cross-sectional view of an integrated circuit package-in-package system 300 as exemplified by the top view of FIG. 1 in a second embodiment of the present invention. A first integrated circuit package system 328 is mounted above and to a die-attach paddle 314. The die-attach paddle 314 includes a first edge 318 and a second edge 320, opposing the first edge 318. The first integrated circuit package system 328 include first integrated circuits 312 stacked in an offset configuration above the die-attach paddle 314 towards the second edge 320. A first active side 324 of each of the first integrated circuits 312 faces the die-attach paddle 314 and is exposed for electrical connection.

The first active side 324 of each of the first integrated circuits 312 is electrically connected with an electrical interconnect 326 to a first external contact 336 of the first integrated circuit package system 328. The first external contact 336 is partially exposed by a first encapsulation 338 of the first integrated circuit package system 328, such as an epoxy mold compound, towards the first edge 318 of the die-attach paddle 314. The first encapsulation 338 covers the first integrated circuits 312, the electrical interconnect 326 between the first active side 324 of each of the first integrated circuits 312 and the first external contact 336, and partially exposes the first external contact 336 for further electrical connections. The first external contact 336 is electrically connected to a first edge lead 304, adjacent to the first edge 318 with the electrical interconnect 326.

A second integrated circuit package system 329 is mounted below and to the die-attach paddle 314. The second integrated circuit package system 329 includes second integrated circuits 332 stacked in an offset configuration towards the first edge 318. A second active side 334 of each of the second integrated circuits 332 faces the die-attach paddle 314 and is exposed for electrical connection. The second active side 334 is electrically connected with the electrical interconnect 326 to a second external contact 340 of the second integrated circuit package system 329.

The second external contact 340 is partially exposed by a second encapsulation 342 of the second integrated circuit package system 329, such as an epoxy mold compound, towards the second edge 320 of the die-attach paddle 314. The second encapsulation 342 covers the second integrated circuits 332, the electrical interconnect 326 between the second active side 334 and the second external contact 340, and partially exposes the second external contact 340 for further electrical connections. The second external contact 340 electrically connects to a second edge lead 306, adjacent to the second edge 320, with the electrical interconnect 326.

A package encapsulation 302, such as a cover of epoxy mold compound, covers the first integrated circuit package system 328, the second integrated circuit package system 329, the electrical interconnect 326 between the first external contact 336 and the first edge lead 304, and the electrical interconnect 326 between the second external contact 340 and the second edge lead 306. The package encapsulation 302 partially exposes the first edge lead 304 and the second edge lead 306 for further electrical connection to the next system level, such as a printed circuit board.

For illustrative purposes, the first integrated circuits 312 are shown with two integrated circuit dice stacked in an offset configuration, although it is understood that the number of integrated circuits or types of integrated circuits may differ. Also for illustrative purposes, the second integrated circuits 332 are shown having two integrated circuit dice stacked in the offset configuration, although it is also understood that the number of integrated circuits or types of integrated circuits may also differ.

Figure 4:
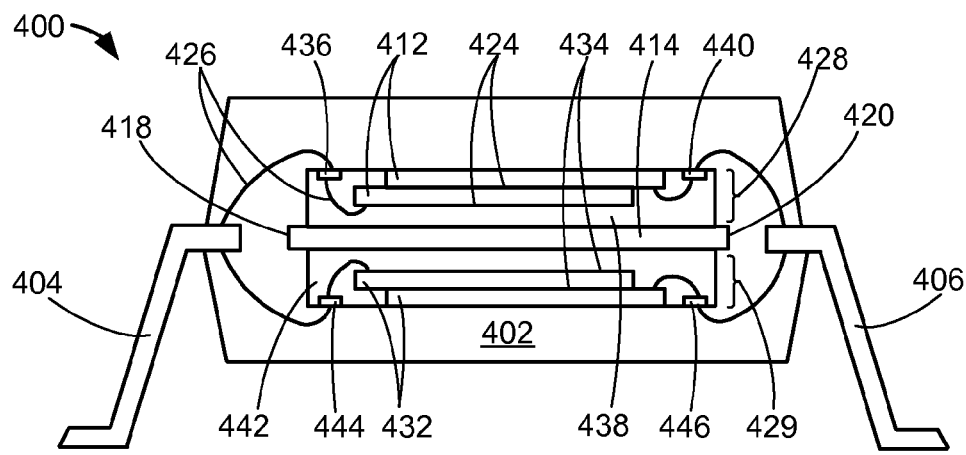
FIG. 4 is a cross-sectional view of an integrated circuit package-in-package system as exemplified by the top view of FIG. 1 in a third embodiment of the present invention.

Referring now to FIG. 4, therein is shown a cross-sectional view of an integrated circuit package-in-package system 400 as exemplified by the top view of FIG. 1 in a third embodiment of the present invention. A first integrated circuit package system 428, such as a packaged integrated circuits, is mounted above and to a die-attach paddle 414. The die-attach paddle 414 includes a first edge 418 and a second edge 420, opposing the first edge 418. The first integrated circuit package system 428 includes first integrated circuits 412 stacked in an offset configuration and towards the first edge 418. A first active side 424 of each of the first integrated circuits 412 faces the die-attach paddle 414 and is exposed for electrical connection. An electrical interconnect 426 connects between the first active side 424 of one of the first integrated circuits 412 that is closer to the first edge 418 and a first external contact 436 of the first integrated circuit package system 428.

The first external contact 436 is partially exposed by a first encapsulation 438, such as an epoxy mold, of the first integrated circuit package system 428 towards the first edge 418 of the die-attach paddle 414. A second external contact 440 of the first integrated circuit package system 428 is partially exposed by the first encapsulation 438 towards the second edge 420 of the die-attach paddle 414. The electrical interconnect 426 connects between the second external contact 440 and the first active side 424 of another of the first integrated circuits 412 that is closer to the second edge 420. The first encapsulation 438 covers the first integrated circuits 412, the electrical interconnect 426 between the first active side 424 and the first external contact 436, the electrical interconnect 426 between the first active side 424 and the second external contact 440, and partially exposing the first external contact 436 and the second external contact 440 for further electrical connections. The first external contact 436 is electrically connected to a first edge lead 404, adjacent to the first edge 418, with the electrical interconnect 426. The second external contact 440 is electrically connected to a second edge lead 406, adjacent to the second edge 420, with the electrical interconnect 426.

A second integrated circuit package system 429, such as a packaged integrated circuits, is mounted below and to the die-attach paddle 414. The second integrated circuit package system 429 includes second integrated circuits 432 stacked in an offset configuration towards the first edge 418. A second active side 434 of each of the second integrated circuits 432 faces the die-attach paddle 414 and is exposed for electrical connection. The electrical interconnect 426 connects between the second active side 434 of one of the second integrated circuits 432 that is closer to the first edge 418 and a third external contact 444 of the second integrated circuit package system 429.

The third external contact 444 is partially exposed by a second encapsulation 442 of the second integrated circuit package system 429 towards the first edge 418 of the die-attach paddle 414. A fourth external contact 446 of the second integrated circuit package system 429 is partially exposed by the second encapsulation 442 towards the second edge 420 of the die-attach paddle 414. The electrical interconnect 426 connects between the fourth external contact 446 and the second active side 434 of another of the second integrated circuits 432 that is closer to the second edge 420.

The second encapsulation 442 covers the second integrated circuits 432, the electrical interconnect 426 between the second active side 434 and the third external contact 444, the electrical interconnect 426 between the second active side 434 and the fourth external contact 446, and partially exposes the third external contact 444 and the fourth external contact 446 for further electrical connections. The third external contact 444 is electrically connected to the first edge lead 404 with the electrical interconnect 426. The fourth external contact 446 is electrically connected to the second edge lead 406 with the electrical interconnect 426.

A package encapsulation 402, such as a cover of epoxy mold compound, covers the first integrated circuit package system 428, the second integrated circuit package system 429, the electrical interconnect 426 between the first external contact 436 and the first edge lead 404, the electrical interconnect 426 between the second external contact 440 and the second edge lead 406, the electrical interconnect 426 between the third external contact 444 and the first edge lead 404, and the electrical interconnect 426 between the fourth external contact 446 and the second edge lead 406. The package encapsulation 402 partially exposes the first edge lead 404 and the second edge lead 406 for further electrical connection to the next system level, such as a printed circuit board.

For illustrative purposes, the first integrated circuits 412 are shown with two integrated circuit dice stacked in an offset configuration, although it is understood that the number of integrated circuits or types of integrated circuits may differ. Also for illustrative purposes, the second integrated circuits 432 are shown having two integrated circuit dice stacked in the offset configuration, although it is also understood that the number of integrated circuits or types of integrated circuits may also differ.

Figure 5:
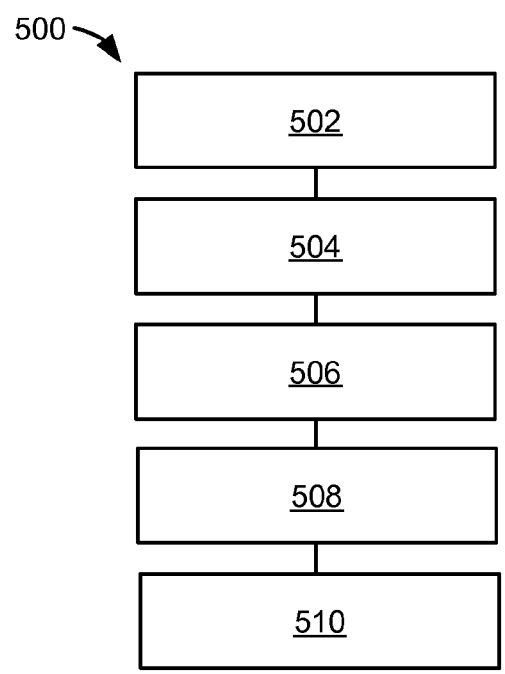
FIG. 5 is a flow chart of an integrated circuit package-in-package system for manufacture of the integrated circuit package-in-package system in an embodiment of the present invention.

Referring now to FIG. 5, therein is shown a flow chart of an integrated circuit package-in-package system 500 for manufacture of the integrated circuit package-in-package system 100 in an embodiment of the present invention. The system 500 includes mounting first integrated circuits stacked in a first offset configuration over a die-attach paddle having a first edge and a second edge, opposing the first edge in a block 502; connecting the first integrated circuits and a second edge lead adjacent the second edge in a block 504; mounting second integrated circuits stacked in a second offset configuration, below and to the die-attach paddle in a block 506; connecting the second integrated circuits and a first edge lead adjacent to the first edge in a block 508; and encapsulating the first integrated circuits, second integrated circuits, and the die-attach paddle, with the first edge lead and the second edge lead partially exposed in a block 510.

It has been discovered that the present invention provides functional extensions to integrated circuit packages improving yield, reducing package profile, and lowering cost. The present invention form package-in-package structure with various internal package types, stacked structure, and warpage mitigation structure.

An aspect of the present invention allows the packaged integrated circuits to be tested prior to assembly in the package-in-package structure of the present invention. The packaged integrated circuits may have integrated circuit dice, passive components, or both in a configuration that is stacked.

Another aspect of the present invention allows for the package-in-package structure to integrated ultra thin or aggressively thinned integrated circuits in the packaged integrated circuits. The packaged integrated circuits protect the thinned integrated circuits to withstand additional handling. The aggressively thinned wafer allows the packaged integrated circuits to have a thin profile despite the cover.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-in-package system comprising:
    a die-attach paddle having a first edge and a second edge, wherein the second die is opposite the first edge;
    first integrated circuits mounted over the die-attach paddle, the first integrated circuits having:
        (a) a first component having a first border and a second border opposite the first border,
        (b) a second component coupled to the first component, the second component having a third border and a fourth border opposite the third border,
        wherein the first component and the second component are stacked in a first offset configuration,
        wherein the first border and the third border each faces the first edge and wherein the second border and the fourth border each faces the second edge, and
        wherein the first border is closer to the first edge than the third border and the fourth border closer to the second edge than the second border;
    a second edge lead adjacent to the second edge, wherein the second edge lead is connected to the first integrated circuits;
    an integrated circuit package system having an inner encapsulation covering second integrated circuits, the integrated circuit package system is mounted below and to the die-attach paddle, wherein the second integrated circuit includes:
        (a) a third component having a fifth border and a sixth border opposite the fifth border,
        (b) a fourth component coupled to the third component, the fourth component having a seventh border and an eighth border opposite the seventh border,
        wherein the third component and the fourth component are stacked in a second offset configuration, the second offset configuration different from the first offset configuration,
        wherein the fifth border and the seventh border each faces the first edge and wherein the sixth border and the eighth border each faces the second edge,
        wherein the seventh border is closer to the first edge than the fifth border and the sixth border is closer to the second edge than the eighth border,
        wherein the third border is closer to the first edge than both the fifth border and the seventh border, and
        wherein the sixth border is closer to the second edge than the second border, the fourth border, and the eighth border;
    a first edge lead adjacent to the first edge, wherein the first edge lead is connected to the second integrated circuits; and
    a package encapsulation covering the first integrated circuits, the integrated circuit package system, and the die-attach paddle, with the first edge lead and the second edge lead partially exposed, with a boundary portion between the inner encapsulation and the package encapsulation separating the inner encapsulation from the package encapsulation, and wherein the first offset configuration and the second offset configuration collectively provide a more balanced weight distribution of the first integrated circuits and the second integrated circuits within the package encapsulation.

2. The system as claimed in claim 1 further comprising a first encapsulation covering the first integrated circuits.

3. The system as claimed in claim 1 further comprising the first integrated circuits connected to the first edge lead.

4. The system as claimed in claim 1 further comprising the second integrated circuits connected to the second edge lead.

5. The system as claimed in claim 1 wherein:
    the inner encapsulation covering the second integrated circuits, partially exposing a first external contact from the inner encapsulation; and
    further comprising:
    a first electrical interconnect connects between the first external contact and the first edge lead.

6. The system as claimed in claim 5 further comprising a second electrical interconnect connecting the second integrated circuits to the first external contact.

7. The system as claimed in claim 5 further comprising:
    a first encapsulation covering the first integrated circuits; and
    a second external contact partially exposed by the first encapsulation connected to the first integrated circuits.

8. The system as claimed in claim 5 further comprising:
    a second external contact partially exposed by the inner encapsulation; and
    a second electrical interconnect connecting the second external contact and the second edge lead.

9. The system as claimed in claim 5 wherein:
    one of the first integrated circuits is further connected to the first edge lead; and
    one of the second integrated circuits is further connected to the second edge lead.

* * * * *

UNITED STATES PATENT AND TRADEMARK OFFICE
CERTIFICATE OF CORRECTION

PATENT NO. : 8,946,878 B2  
APPLICATION NO. : 11/951958  
DATED : February 3, 2015  
INVENTOR(S) : Chin et al.

Page 1 of 1

It is certified that error appears in the above-identified patent and that said Letters Patent is hereby corrected as shown below:

In the Claims:

Column 7, Claim 1, line 27, delete "second die", and insert therefor --second edge--

Column 7, Claim 1, line 41, delete "border closer", and insert therefor --border is closer--

Column 7, Claim 1, line 48, delete "system is mounted", and insert therefor --system mounted--

Signed and Sealed this  
Twenty-ninth Day of March, 2016

Michelle K. Lee  
*Director of the United States Patent and Trademark Office*